United States Patent [19]
Faulkner et al.

[11] Patent Number: 5,420,536
[45] Date of Patent: May 30, 1995

[54] LINEARIZED POWER AMPLIFIER

[75] Inventors: Michael Faulkner, Moonee Ponds; Mark A. Briffa, Gladstone Park, both of Australia

[73] Assignee: Victoria University of Technology, Australia

[21] Appl. No.: 212,946

[22] Filed: Mar. 15, 1994

[30] Foreign Application Priority Data
Mar. 16, 1993 [AU] Australia ............... PL7828

[51] Int. Cl.⁶ .................. H03F 1/32; H03G 3/30
[52] U.S. Cl. .................. 330/149; 330/129; 330/275; 330/285; 330/136; 455/126; 455/127
[58] Field of Search ............ 330/127, 128, 129, 149, 330/151, 279, 285, 297, 136; 455/126, 127

[56] References Cited

U.S. PATENT DOCUMENTS

| | | | |
|---|---|---|---|
| 4,546,326 | 10/1985 | Van Uffelen et al. | 330/129 |
| 5,101,173 | 3/1992 | DiPiazza et al. | 330/279 X |
| 5,142,240 | 8/1992 | Isota et al. | 330/149 |

FOREIGN PATENT DOCUMENTS

| | | | |
|---|---|---|---|
| 261232 | 11/1987 | Japan | 455/127 |
| 94527 | 4/1991 | Japan | 455/127 |
| 3255710 | 11/1991 | Japan | 330/149 |
| 2209639 | 5/1989 | United Kingdom | 330/149 |
| 2239755 | 7/1991 | United Kingdom | 330/149 |

Primary Examiner—James B. Mullins
Attorney, Agent, or Firm—Andrus, Sceales, Starke & Sawall

[57] ABSTRACT

A linearized power amplifier is provided which comprises a non-linear radio frequency (RF) power amplifier, a linearization circuit such as a Cartesian Feedback circuit, an RF feedback circuit; an IF feedback circuit; or a feedforward circuit, and a dynamic bias modulation circuit for modulating an operating voltage of the amplifier. The dynamic bias modulation means includes an envelope determining circuit, signal processing circuits in which predetermined data or a simplified transfer function determined from measured characteristics of the amplifier is stored and used to produce power bias and/or base or gate bias signals, and driver circuits for modulating the power supply voltage and/or base or gate bias voltage of the RF amplifier in response to the bias signals. The dynamic bias modulation may be used with a BJT-based, and FET-based or any other type of RF power amplifier. With the right combination of power supply and base or gate bias modulation the efficiency of the RF amplifier can be maximised for a given output power, and the combination of linearization means and high level power supply and/or base or gate bias modulation gives the benefits of improved spectral control and intermodulation distortion reduction coupled with high efficiency.

17 Claims, 11 Drawing Sheets

LINEARIZED POWER AMPLIFIER

FIELD OF THE INVENTION

This invention relates to the improved linearization of non-linear amplifiers for the purposes of efficient Radio Frequency (RF) power amplification of any RF signals containing amplitude or amplitude and phase modulation.

BACKGROUND OF THE INVENTION

Increasing demand for mobile and personal communication services has renewed interest in spectrally efficient modulation schemes. Since the most efficient forms of RF power amplification are non-linear, CPM (Continuous Phase Modulation) schemes have been preferred for portable wireless applications (e.g Gaussian Minimum Shift Keying—GMSK). Because of growing pressures for extra capacity however, the advantages of retaining a constant envelope are giving way to linear modulation (e.g $\pi/4$ Shift DQPSK).

Although the filtering applied in linear modulation schemes generally produces gains in spectrum utilisation, envelope variations are also introduced. Such signals when passed through non-linear RF amplifiers undergo distortion (Amplitude-to-Amplitude Modulation & Amplitude-to-Phase Modulation [AM/AM & AM/PM]) which results in a spreading of the spectrum beyond the allocated channel and reduced performance. The inefficiency of conventional linear RF amplifiers (e.g Class A operated under appropriate back-off) would have a disastrous effect on the battery life of portable wireless transmitting equipment. Improvements in RF amplifier efficiency would directly lead to improvements in the talk-time, recharging intervals, and size and weight of the overall wireless unit. The ideal amplifier for linear modulated portable systems is therefore a linear amplifier which is also power efficient.

Because linear amplifiers can amplify signals with any combination of amplitude and phase modulation, the choice of modulation scheme is not limited by the transmitter and hence can be software selectable. This is advantageous in military applications, and in commercial applications crossing international borders and standards. Other applications for linear amplification include various digital cellular and Private Mobile Radio (PMR) systems, traditional Amplitude Modulation (AM) and Single Side-Band (SSB) systems, and instances where transmitter turn-on is to be well controlled such as bandlimited pulse systems found in radar and paging applications and in Time Division Multiple Access (TDMA) systems. Linear Amplifiers can also accommodate the envelope variations caused by the combination of multiple signals such as those found in multicarrier basestations.

Feedforward linearization is one way non-linear but efficient amplifiers can be linearized. It is based on cancelling the distortion of the amplifier at the output. The distortion or error signal is measured by comparing the amplifier output signal with the input. After suitable scaling and delay matching this error signal, which is out of phase with the distortion, is applied to the output resulting in a reduction in the distortion. The error signal must be amplified by a linear RF power amplifier however. This results in a compromise since in general, as the efficiency of an RF power amplifier increases, so does its distortion and hence the error signal level to be amplified by the linear amplifier. The larger the error signal level the larger the linear amplifier and hence the greater the power consumption and the lower the efficiency. Such systems have been applied particularly for wideband linearization schemes. A typical example is disclosed by P. B. Kenington, M. A. Beach, A. Bateman and J. P. McGeehan in PCT Pat. No. WO 91/16760.

It has long been known that feedback can linearize non-linear systems. Cartesian Feedback for example, which uses negative feedback of the baseband quadrature modulation provides excellent reduction in intermodulation distortion with low complexity and cost. A typical example of what is achievable with cartesian feedback is given in by M. Johannson and T. Mattsson, "Transmitter Linearization using Cartesian Feedback for Linear TDMA Modulation", in the proceedings of the 41st IEEE Vehicular Technology Conference, St. Louis, USA, VTC-91, pp 439–444, May, 1991. Other typical feedback techniques include Polar Feedback discussed in U.S. Pat. No. 5,023,937; IF (Intermediate Frequency) Feedback demonstrated by K. G. Voyce and J. H. McCandless, "Power Amplifier Linearization Using IF Feedback", in the IEEE MTT-S digest, pp 863–866, 1989; and RF Feedback demonstrated by H. A. Rosen and A. T. Owens, "Power Amplifier Linearity Studies for SSB Transmissions", IEEE Transactions on Communications Systems, pp 150–159, June, 1964.

High level modulation of the power supply of an RF power amplifier, for the purposes of amplitude (or envelope) modulation, is a well established technique which provides good power efficiency when combined with efficient high level power supply modulators. This is the basis for amplitude feedback only techniques of EP Pat. No. 431201 FIG. 19 (also WO 9100653); of U.S. Pat. No. 3,900,823 FIGS. 1 and 2; of K. Chiba, To Nojima and S. Tomisato, "Linearized Saturation Amplifier with Bidirectional Control for Digital Mobile Radio", in the proceedings of Globecomm (IEEE), pp 1958–1962, 1990; and of M. J. Koch and R. E. Fisher, "A High Efficiency 835MHz Linear Power Amplifier for Digital Cellular Telephony", in the proceedings of the 39th IEEE Vehicular Technology Conference, USA, VTC89, pp 17–18, May, 1989. The problem with these systems is the relatively larger bandwidths of the amplitude signals compared with corresponding baseband quadrature modulation and the inability to control AM-PM distortion. Consequently the spectral control is generally inferior to that of Cartesian Feedback, IF Feedback and RF Feedback. Full Polar Feedback (both Amplitude and Phase feedback) overcomes the limitation of the inability to control AM-PM distortion, but still suffers from the bandwidth expansion problem on both the amplitude and phase signals.

Dynamic control of the DC gate bias has also been shown to improve amplifier efficiency by A. A. M. Saleh and D. C. Cox, "Improving the Power-Added Efficiency of FET Amplifiers Operating with Varying Envelope Signals", IEEE Transactions on Microwave Theory and Techniques, Vol. 31, January 1983. U.S. Pat. No. 4631491 also demonstrates that feedback can be used to control the collector and base bias in a Bipolar Junction Transistor based RF amplifier to improve the efficiency of the amplifier.

SUMMARY OF THE INVENTION

From the foregoing, it will be appreciated that it is desirable to linearize a non-linear RF power amplifier with the object of improving the linearity of an RF power amplifier and thus reducing its intermodulation distortion products and to do so with a high level of power efficiency.

According to a broad aspect of the invention, there is provided a linearized power amplifier comprising a non-linear radio frequency (RF) power amplifier, dynamic bias modulation means for modulating an operating point of the RF amplifier, and linearization means, such as Cartesian Feedback, IF Feedback, RF Feedback or Feedforward, for linearizing the RF amplifier.

Preferably, the dynamic bias modulation means includes envelope generating means for producing an envelope signal representing the envelope of the RF signals, and signal processing means for processing the envelope signal whereby an optimum operating voltage, such as the power supply voltage and/or the base or gate bias voltage, for the RF amplifier is selected for the desired RF output envelope level. The power supply voltage and/or the base or gate voltage of the RF amplifier is preferably modulated by power driver means in accordance with power bias signals and/or base or gate bias signals generated by the signal processing means.

Preferably, there is also provided delay means equalising the delay between the dynamic bias modulation means and the linearization means.

The signal processing means preferably comprises memory means including predetermined data computed from measured characteristics of the amplifier or a simplified transfer function determined from the measured characteristics of the amplifier, and means for producing a power bias signal and/or a base or gate bias signal representing the optimum bias voltage corresponding to the envelope signal from the envelope generating means. The signal processing means can thus optimise the operation of the RF power amplifier at its most efficient point for the required instantaneous output power.

According to another aspect of the present invention there is provided dynamic bias modulation means for modulating an operating point of an RF amplifier comprising: envelope generating means for producing an envelope signal representing the envelope of the RF signals: signal processing means for processing the envelope signal including memory means containing predetermined data computed from measured characteristics of the amplifier, and dynamic bias means for producing dynamic bias modulation signals each of which represents an optimum operating voltage for the RF amplifier corresponding to an instantaneous envelope signal received from the envelope generating means; and power driver means for modulating an operating voltage of the RF amplifier such as power supply voltage and/or the base or gate bias voltage in response to power bias and/or bias signals from the signal processing means.

According to a further aspect of the invention there is provided a method of improving the efficiency of a linearized radio frequency (RF) power amplifier comprising the steps of: measuring the characteristics of the RF amplifier, generating envelope signals representing the envelope of the RF input signal to the RF amplifier, processing the envelope signals in accordance with the measured characteristics of the RF amplifier to produce bias signals corresponding to optimum operating voltages for the desired RF output envelope, and dynamically modulating the operating voltage of the RF amplifier in response to said bias signals.

Dynamic variation or modulation of an operating point of the RF amplifier may broadly be referred to as "dynamic bias". For example, with Bipolar Junction Transistor (BJT) based R.F power amplifiers, dynamic bias encompasses variation in collector and/or base voltages. For Field Effect Transistor (FET) based RF power amplifiers, the variation in operating point is achieved by drain and/or gate bias modulation. Dynamic bias may be referred to as "high level power supply modulation" which refers to modulation of the collector for a BJT amplifier, the drain of an FET amplifier, the anode of valves and so on. One form of dynamic bias also refers to the bias control of other active amplification devices such as the family of Field Effect Transistors FET's) (including Junction FETs, Metal Oxide Silicon FETs, GAsFETs etc.) and thermoionic devices such as triodes and other valves and Travelling Wave Tube Amplifiers. Further reference to dynamic bias will refer to any of these devices.

High level power supply modulation without base or gate bias, and dynamic base or gate bias modulation in an amplifier having a substantially fixed power supply have both been found to increase the efficiency of an RF power amplifier with linearization means such as Cartesian, IF or RF Feedback or Feedforward systems. Each of these bias modulation systems are therefore included within the scope of this invention.

However, in a preferred embodiment of the present invention, a linearized RF amplifier incorporates both high level power supply modulation means, such as collector or drain modulation, for modulating the power supply voltage of the RF amplifier and base or gate bias modulation means for modulating the base or gate bias voltage of the RF amplifier. With the right combination of power supply and base or gate bias modulation, it is possible to maximise efficiency improvements for a given output power of the RF amplifier. Moreover, the combination of linearization means, such as Cartesian, IF or RF Feedback or Feedforward, and high level power supply or dynamic bias modulation gives the benefits of excellent spectral control and intermodulation distortion reduction of the linearization scheme coupled with high efficiency. Furthermore, a means of accurate power control is provided as well as a relaxation in the power supply modulator requirements compared to those utilized in polar feedback systems.

BRIEF DESCRIPTION OF THE DRAWINGS

The novelty and distinct advantages-of the present invention will become apparent to those skilled in the art by reading the following specification and by reference to the drawings in which.

DETAILED DESCRIPTION OF THE PREFERRED EMBODIMENTS

The detailed description set forth below in connection with the appended drawings is intended merely as a description of the presently preferred embodiments of the invention, and is not intended to represent the only form in which the present invention may be constructed or utilised (e.g. the use of FETs or valves instead of BJT active devices). The description describes the implementation of the invention only in connection with the illustrated embodiments. It is to be understood, however, that the implementation of the invention can be accomplished by different electronic embodiments and it is intended these be encompassed within the spirit and scope of the invention.

Figure 1A:
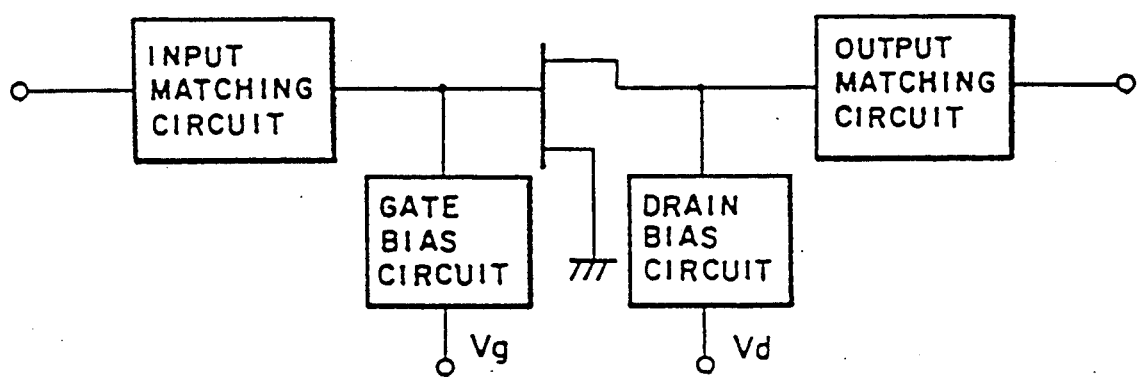
FIG. 1(a) is a block diagram showing a typical prior art example of an amplifier using a field effect transistor (FET).
Figure 1B:
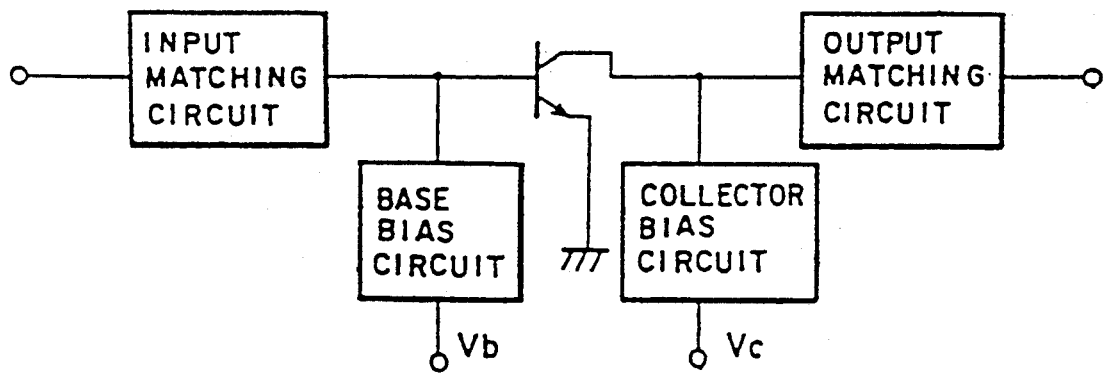
FIG. 1(b) is a block diagram showing a typical prior art example of an amplifier using a bipolar junction transistor (BJT).

In order to achieve the objective of efficient linear RF amplification an efficient but non-linear RF amplifier 6 has been utilised as the basis for this invention. This amplifier can be based on a range of active devices such as BJTs,. FETs, and Valves. Typical examples of such amplifiers are shown in the prior art drawings of FIG. 1(a) and FIG. 1(b) showing a FET and BJT, respectively, along with associated elements. It can also be based on different classes of operation e.g Class AB, B, C, D, E or F and others. The preferred embodiments described here are based on a BJT RF power amplifier with the operating class dependent on the base bias voltage.

Through the application of the described techniques contained in the description of the preferred embodiments of the present invention, the non-linear amplifier is linearized so that the amplifier retains its inherent efficiency yet its distortion is sufficiently minimised. Other techniques have been employed to achieve a similar end. These techniques can be summarised as incorporating feedback, feedforward, or predistortion (fixed or adaptive) techniques.

It has long been known that negative feedback can linearize non-linear systems. To linearize RF amplifiers, the negative feedback can be formed a number of ways, namely—at RF or IF, or at baseband in the form of Polar representation or Cartesian representation.

Figure 1C:
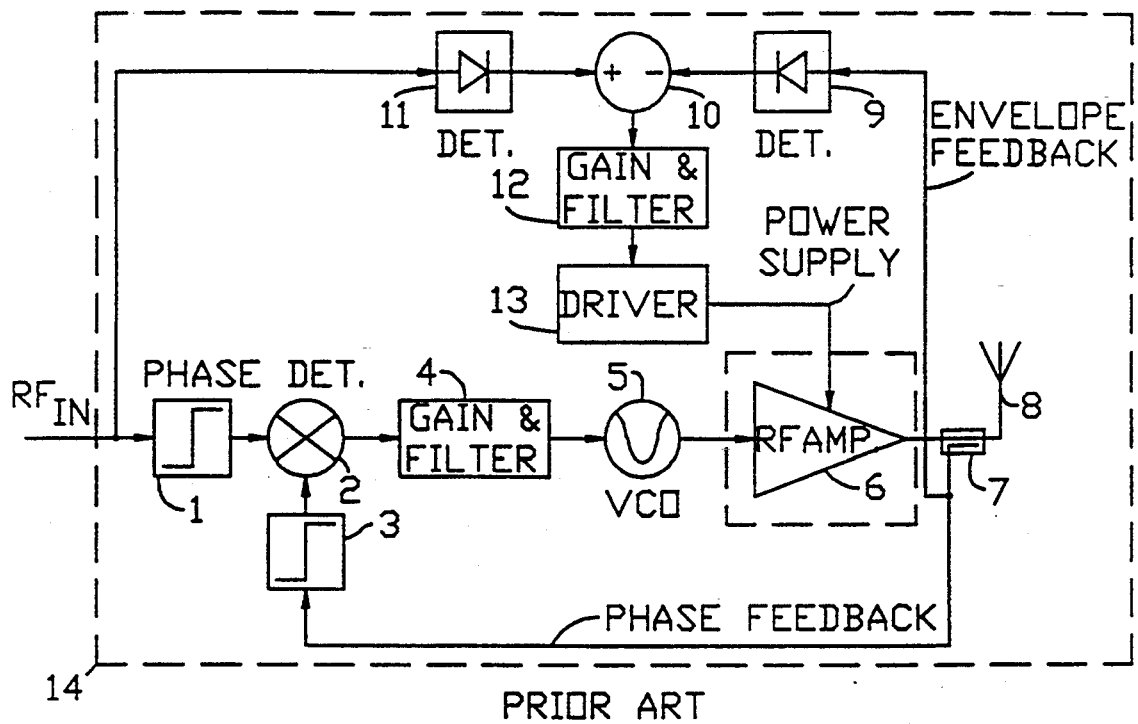
FIG. 1(c) is a block diagram showing a typical prior art example of a full Polar Feedback linearization System utilising exact high level power supply modulation.

Polar feedback 14 utilises negative feedback of the baseband amplitude and phase of the signal to be amplified. The basic principle is shown in the prior art implementations of FIG. 1 and FIG. 2. In FIG. 1 the RF input signal is essentially broken up into two components, namely—amplitude and phase. A hard limiter 1 obtains the phase information and an envelope detector 11 obtains the amplitude. These two signals then form the basis for the polar feedback loop.

The phase is compared by a phase only sensitive detector formed by 1,2,3. The resultant phase difference is then filtered by 4 and applied to a VCO (Voltage Controlled Oscillator) 5. This VCO signal (after suitable amplification) is large enough to drive the RF amplifier 6 to saturation thus ensuring efficient amplification. To complete the phase feedback loop some of the signal is tapped off by an RF coupler 7 and is fedback to the phase detector 3. This closed loop phase feedback is commonly referred to as a PLL (Phase Locked Loop).

The envelope of the input obtained by 11 is compared with the output by a subtracter 10. The resulting error signal is amplified and filtered by 12 which provides the necessary amplitude predistortion to the high level driver 13. The high level driver 13 is normally intended to be highly efficient and usually incorporates switched-mode techniques. The amplitude feedback loop is closed by a signal obtained by envelope detector 9 which itself is driven by the RF coupler 7. The means by which the envelope is obtained is not limited to simple envelope detection. Synchronous detection can be achieved by homodyning the RF signals with their hard-limited equivalents.

Although the polar loop has the potential for high efficiency, the amplitude and phase signals have wide bandwidths (except perhaps AM systems) as a result of the non-linear relationship between these signals and the actual RF signal channel spectrum. Consequently, the polar loop components processing these signals must be capable of accommodating the larger bandwidths. Failing to do so minimises the linearization efficacy. The weakest link in regards to bandwidth is the driver. If it is to accommodate high bandwidth signals effectively and utilises switch-mode techniques, the switching frequency must be made high. A high switching frequency however results in greater switching losses and imposes a limit as to how high the switching frequency can be made. As will be shown, the present invention relaxes the need for the driver signal to track the envelope exactly and so provides superior linearization performance.

Figure 2:
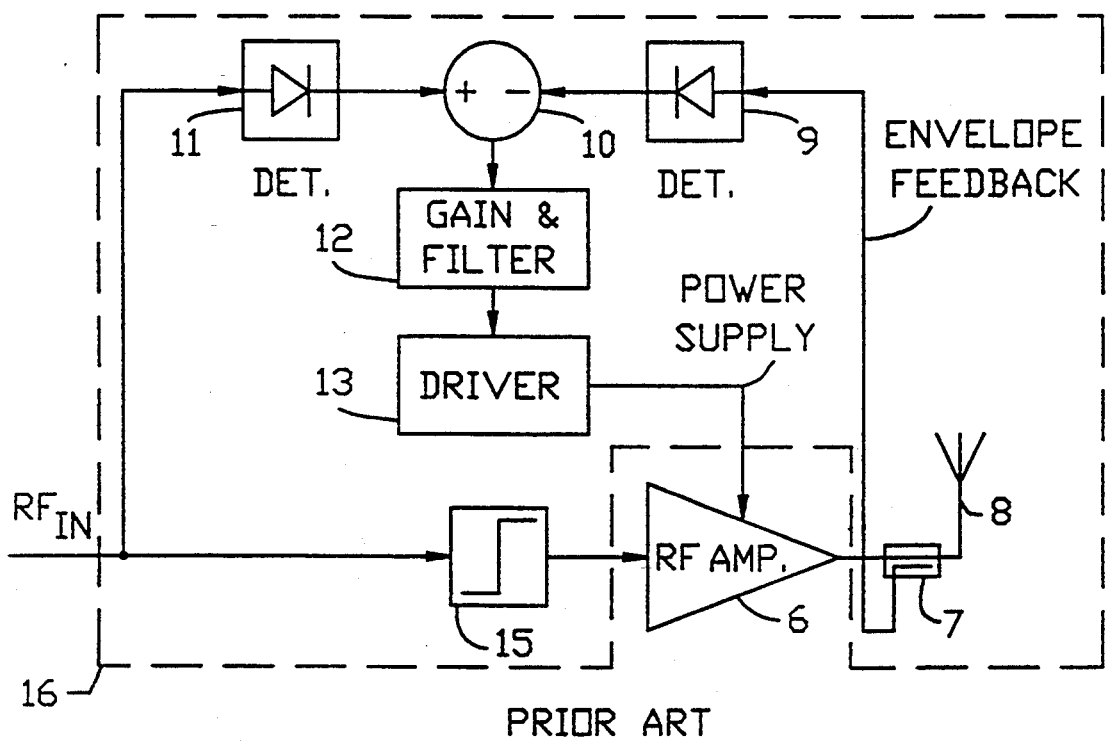
FIG. 2 is a block diagram showing a typical prior art example of an envelope only Polar Feedback linearization System utilising exact high level power supply modulation.

The second prior art example of FIG. 2 demonstrates amplitude-only feedback. Such a technique is applicable in systems where the AM-PM distortion is low and is generally not suitable for amplifiers using BJT's. In common with the previous prior art example of FIG. 1, this system has a hard limiter 15 to enable the RF amplifier 6 to be hard driven and hence to operate at high efficiency. This envelope feedback circuitry is the same as that of FIG. 1. An envelope detector 11 obtains the envelope of the input which is compared to the output envelope by 10. After suitable gain and filtering 12 the resulting predistort drive is high level modulated by driver 13 and applied to the RF amplifier 6. The feedback is obtained by an RF coupler 7 which allows the detector 9 to provide the feedback envelope signal necessary to close the loop. The amplitude only feedback technique suffers from the same bandwidth expansion problem described for FIG. 1. Amplitude-only. feedback is often used because of its simplicity.

Cartesian Feedback which uses negative feedback of the baseband quadrature modulation has been shown to provide excellent reduction in intermodulation distortion with low complexity and cost.

Figure 3:
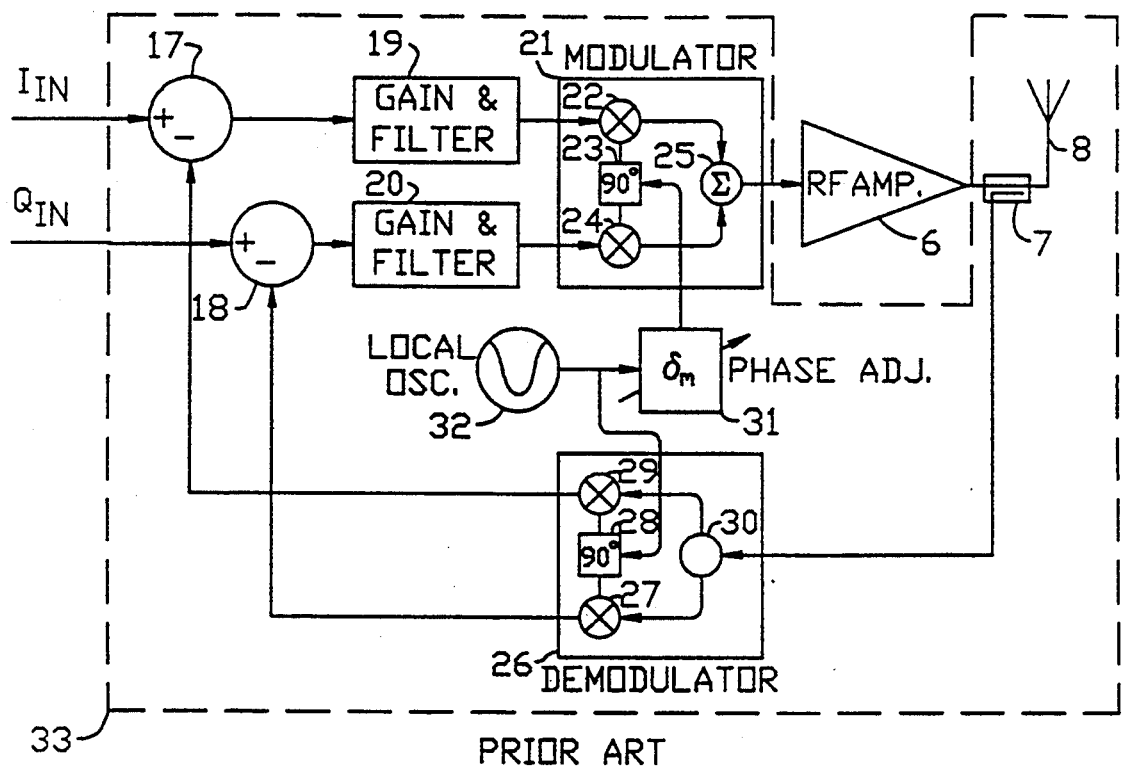
FIG. 3 is a block diagram showing a typical prior art example of a Cartesian Feedback linearization System.

The basic principle of Cartesian Feedback 33 is depicted in the prior art drawing of FIG. 3. The baseband inputs to the system in quadrature format—which are often termed I and Q or cartesian components, form the reference signals for the loop. The forward path of the system consists of the main control loop gain and compensation filters 19,20, a synchronous I-Q Modulator 21, a non-linear RF power amplifier 6 and the antenna 8 acting as the output load.

The conventional I-Q modulator 21 is comprised of two mixers 22, 24, a 90° phase splitter 23, and an RF combiner 25.

The feedback path obtains a portion of the transmitter output via an RF coupler 7, the signal from which is then synchronously demodulated 26. The resultant demodulated I-Q baseband signals are used as the primary feedback signals and are subtracted 17-18 from the input. The resultant error signals become the necessary pre-distort drive to linearize the non-linear RF power amplifier.

The conventional I-Q demodulator 26 is comprised of an RF splitter 30, two mixers 22, 24, and a 90° phase splitter 23.

Synchronism between the modulator and demodulator is obtained by splitting a common RF carrier 32. Due to differences in the forward and feedback paths a phase adjustor 31 is necessary to maintain the correct relationship between the input signals and feedback signals.

The Cartesian Feedback system when properly assembled can give power added efficiencies of around 50% with a two-tone test coupled with excellent intermodulation distortion reduction. Further, by applying techniques to be described in the preferred embodiments, additional efficiency improvements can be achieved.

Figure 4:
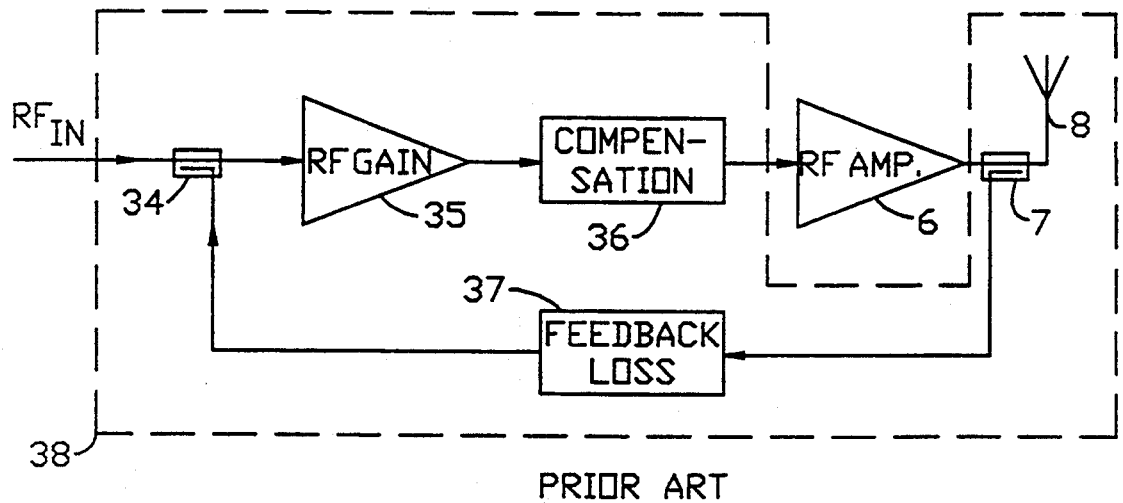
FIG. 4 is a block diagram showing the typical prior art example of an RF Feedback linearization System.

RF feedback 38 is shown in the prior art illustration of FIG. 4. This technique uses standard negative feedback of the actual RF signal. The input coupler 34 allows the feedback to be subtracted from the RF input. The resulting error signal is then amplified by an amplifier 35. Feedback compensation is by way of a bandpass filter 36. The output coupler 7 couples some of the output back through the feedback loss circuit 37 to complete the feedback loop. The feedback loss 37 determines the overall gain of the linear amplifier and can actually be absorbed by the two couplers 34 and 7. In general the difficulty associated with RF feedback is the practical implementation of the bandpass filter 36 which is usually extremely narrow at the RF operating frequency.

Figure 5:
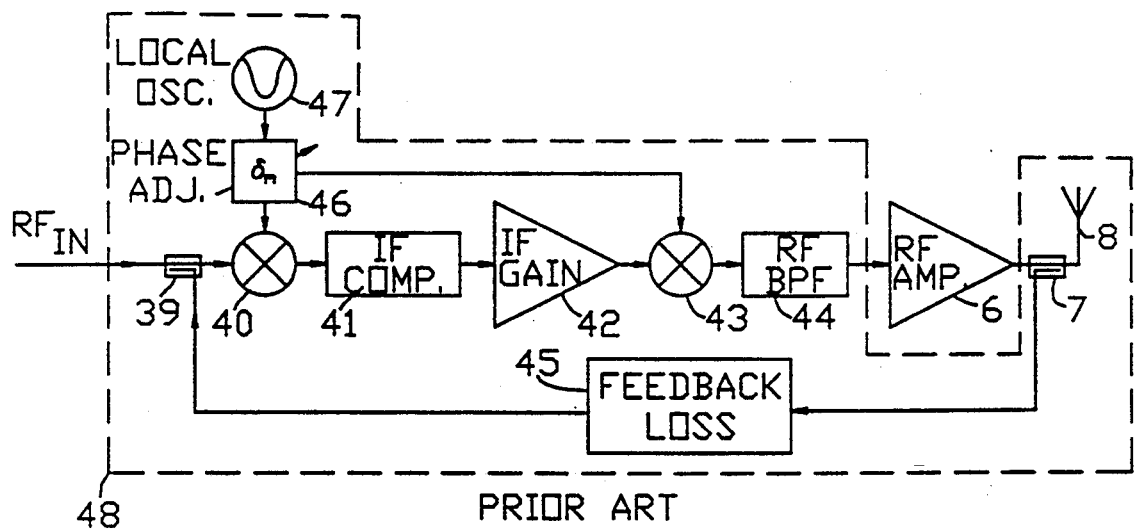
FIG. 5 is a block diagram showing the typical prior art example of an IF Feedback linearization System.

IF feedback 48 as shown in the prior art illustration of FIG. 5, overcomes the difficulty associated with the RF filter of the previous case by bringing the filter down to an IF frequency. The operation of IF feedback is similar to RF feedback except IF conversion is utilised within the loop. The RF input is first processed by a coupler 39 which provides the feedback connection from the output. The signal is then IF converted by a mixer 40 and passed through the IF bandpass compensation filter 41 and IF loop gain 42. The result from this process is an IF equivalent of the necessary RF prodistortion. This IF predistortion signal is reconverted to the RF frequency by a mixer 43 and RF bandpass filter 44 and then applied to the RF amplifier 6. The output from the amplifier is coupled by coupler 7 and fed-back to the input coupler 39 via the feedback loss network 45. The two remaining components in the figure provide the local oscillator 47 and phase alignment 46 components necessary for the IF conversion process.

Figure 6:
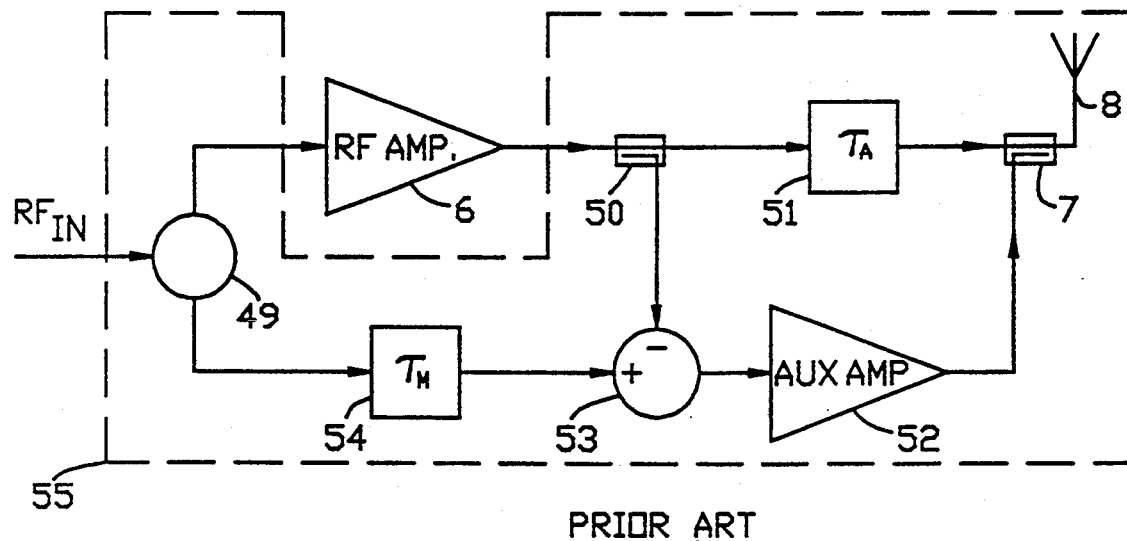
FIG. 6 is a block diagram showing the typical prior art example of a Feedforward linearization System.

An alternative to the feedback systems described is the RF feedforward system 55 of FIG. 6. In this prior art example the RF input is first split by a splitter 49. One arm of the splitter provides the excitation signal for the RF amplifier 6. The output from tiffs amplifier is coupled 50 to a subtracter 53 which compares the amplifier's output with a time delayed 54 version of the input. The coupler 50 is designed such that it provides a coupled loss roughly equivalent to the amplifier 6 gain. The time delay 54 is also designed such that is roughly equivalent to the amplifier's 6 time delay. The result from the comparison 53 represents the distortion generated by the amplifier 6. This distortion is amplified by the auxiliary linear power amplifier 52 for power combining by 7 to a delayed 51 version of the amplifier output. The combination by 7 results in destructive cancellation of the RF amplifier 6 distortion provided the delay 51 matches the delay of the auxiliary amplifier 52. The matching of delays and gains/losses is the main practical difficulty with this technique. The power consumption of the linear auxiliary amplifier 52 results in the efficiency of the feedforward to be reduced. As will be shown, application of the present invention and making the main RF amplifier 7 more linear will require a smaller auxiliary amplifier 52 and so improve the overall efficiency.

The source of excess power consumption in the linearization systems of FIGS. 3, 4, 5, and 6 discussed in this disclosure stems from the manner by which the desired RF envelope output level is achieved. Since these linearization schemes can only drive the input of the RF amplifier 6, it follows that the desired RF envelope output level is achieved by a change in the amplifier RF input drive level. Since in general, RF amplifiers operate more efficiently in saturated mode, the reductions in amplifier RF input drive levels result in the amplifier not operating at its peak efficiency. This is especially true at low output levels in the power control range. It is therefore advantageous to maintain the amplifier RF input drive at a level which achieves the highest power added efficiency. With this constraint however, the necessary envelope level modulation must be obtained via other means. The means adopted in accordance with the present invention is by way of high level power supply modulation 57 of the RF amplifier 6 with or without base-(or gate) bias modulation 58 or by having a fixed power supply voltage with a variable base or gate bias modulation 58.

Figure 7:
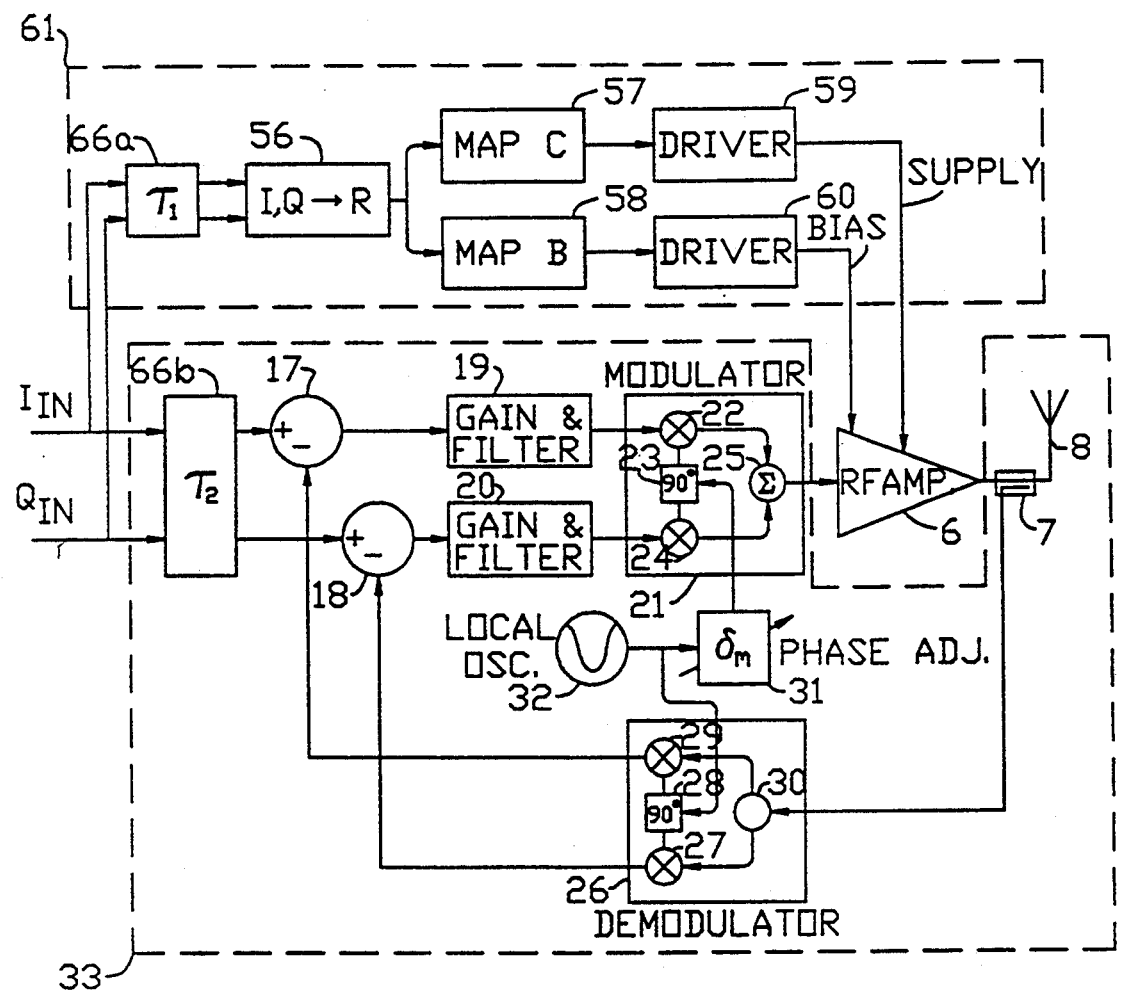
FIG. 7 is a block diagram of the first preferred embodiment applied to a Cartesian Feedback linearization scheme where the envelope is obtained from the quadrature inputs.

FIG. 7 is a drawing of the first preferred embodiment and illustrates how this invention functions as applied to Cartesian feedback. The standard Cartesian feedback loop is represented by 33. 61 represents the additional components which give the added efficiency improvements to the Cartesian Feedback System.

First the quadrature input signals are applied to an envelope determining circuit 56. This circuit essentially determines the envelope "R" from I and Q, from the simple pythagorean equation:

$$R = \sqrt{I^2 + Q^2}$$

The envelope determining circuit means 56 may range from a DSP circuit where "R" can be obtained via calculation or look-up table, to an analog computing circuit or even an RF envelope detecting circuit 62 (FIGS. 11-14).

Figure 8:
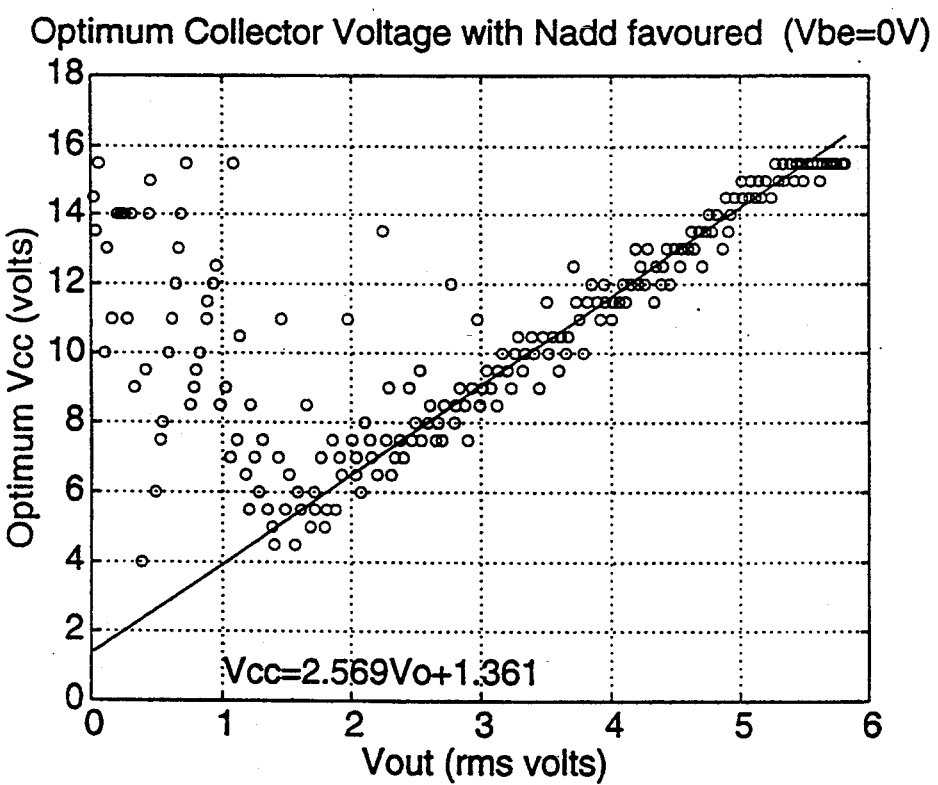
FIG. 8 is an example graph representing the optimum (based on best power-added efficiency) collector voltage with the base voltage fixed as a function of desired output levels.
Figure 9:
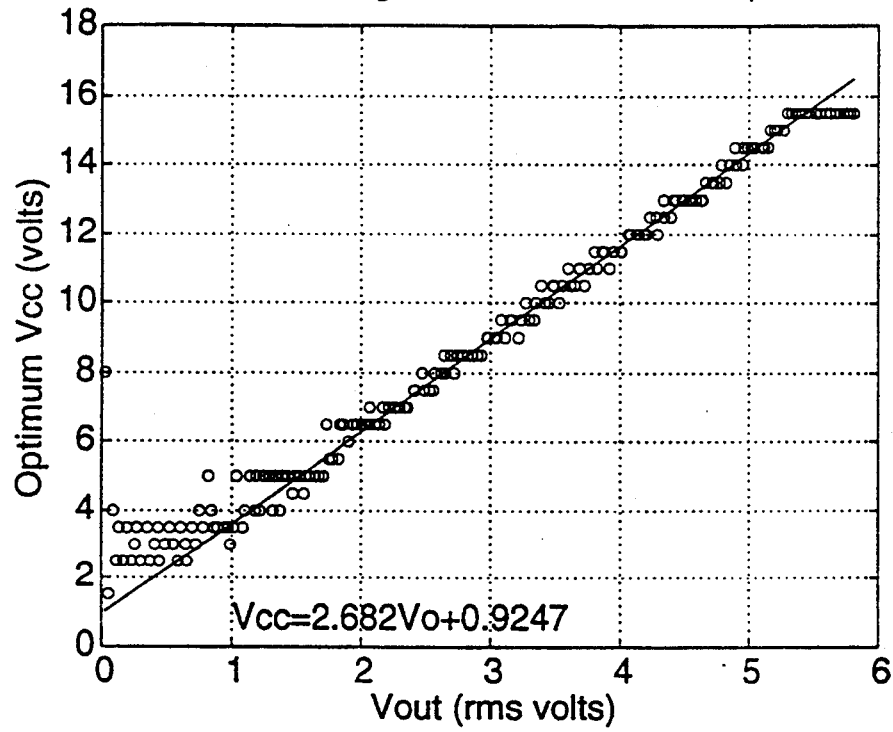
FIG. 9 is an example graph representing the optimum (based on best power-added efficiency) collector voltage with the base voltage variable in accordance with FIG. 10 as function of desired output levels.
Figure 10:
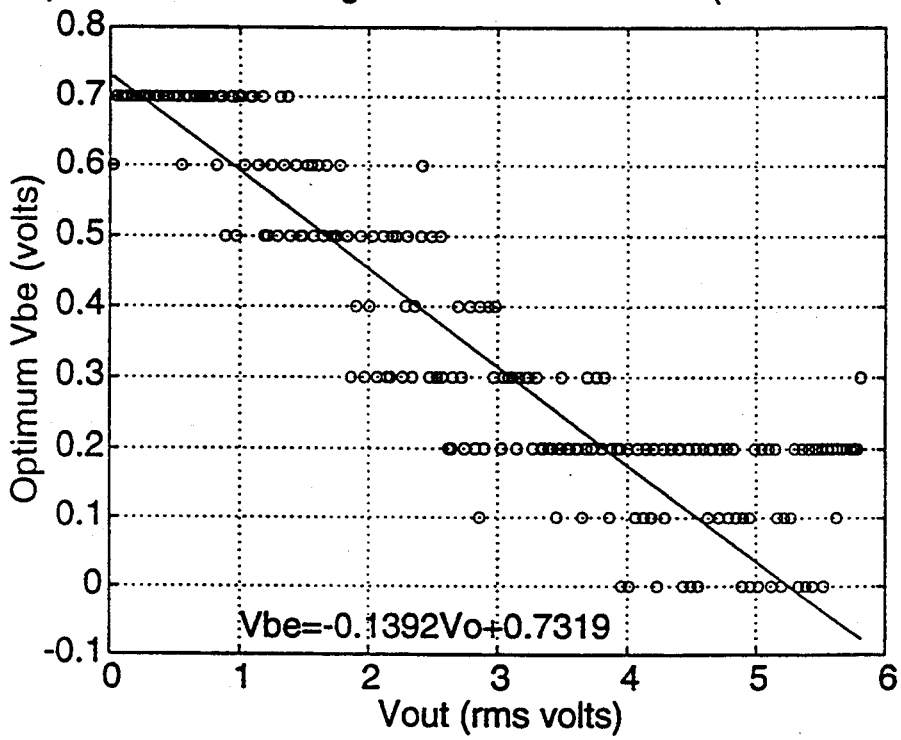
FIG. 10 is an example graph representing the optimum (based on best power-added efficiency) base voltage with the collector voltage variable in accordance with FIG. 9 as function of desired output levels.

Once the "R" signal is obtained it is modified by functions 57 and 58 which select the optimum RF amplifier power supply voltage and DC bias voltage for the desired output RF envelope level. These functions were pre-computed and obtained from the measured characteristics of the amplifier. A computer program was then utilised to process the measured data and obtain the necessary functions shown as MAP C 57 and MAP B 58. The results of such a process are shown in FIG. 8, FIG. 9 and FIG. 10. FIG. 8 shows the optimum (for the best power added efficiency, Nadd) collector voltage of a BJT based RF power amplifier with the base voltage fixed to zero. FIGS. 9 and 10 present the optimum (for the best power added efficiency, Nadd) collector and base voltages when both are varied. The straight-line approximation given by these graphs form the basis of the maps. The circular dots are the actual measurement data showing the measurement uncertainty.

These functions could again be built using DSP techniques (and indeed included in the "R" calculating circuit) or by a simple analog approximation. The "R" calculating circuit could also be simplified by calculating "R²" or some other function of R, and using this signal to drive the mapping functions 57,58 instead of "R".

The resultant signals from these functions is then applied to the RF power amplifier by power supply drivers 59,60. These drivers used in accordance with the present invention may utilise a switched mode power supply for 59, although other electronic embodiments such as resonant, semi-resonant, or multi-resonant supply converters, Class D modulators etc. could be utilised, and a linear driver for 60. It is also possible due to the toleration of the high level power supply modulation inexactness, to switch in different power supply rails for 59.

In general, the signal delay through the dynamic bias circuits is different to that of the linearization circuitry. Consequently, it is possible to improve the operation of the dynamic bias circuits by introducing delay blocks 66a and 66b to equalise the difference in the signal paths. It must be stated that these delay blocks are optional and that the preferred embodiments of the invention described in this disclosure encompass both embodiments with the delay blocks of 66a and 66b and embodiments without the delay blocks of 66a and 66b. Also, if delay is to be equalised, only one delay block is generally required. That delay block is added in the signal path which offers the smallest delay so that the overall delay in that signal path is brought up to the delay of the other larger delay signal path.

Figure 11:
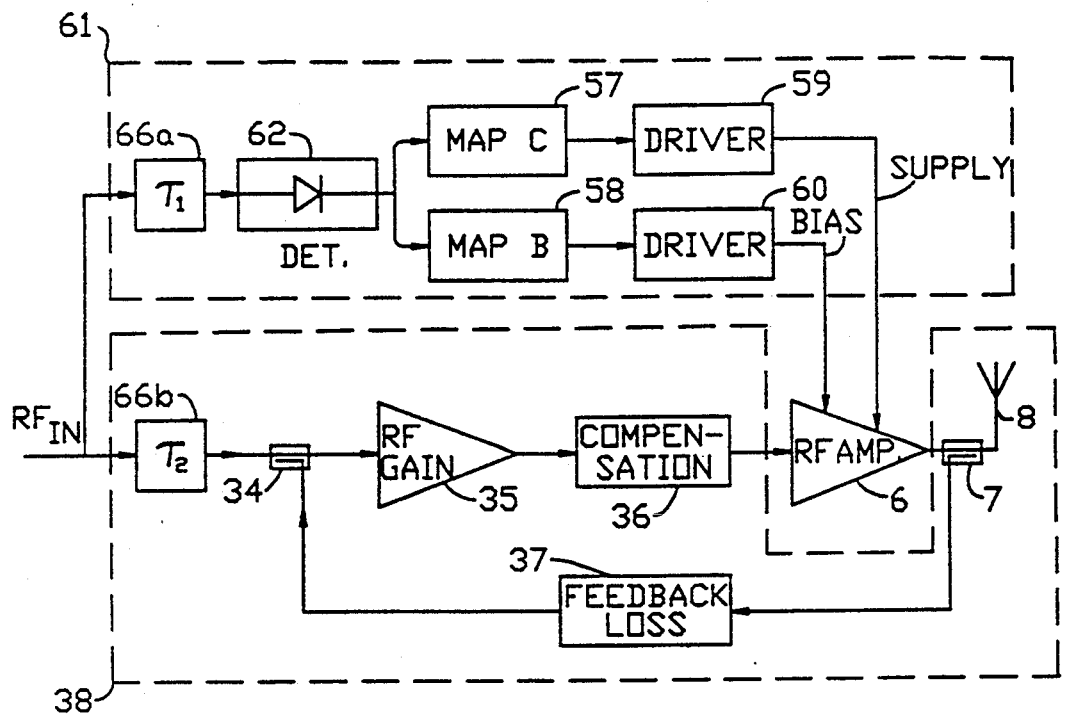
FIG. 11 is a block diagram of the second preferred embodiment applied to RF feedback linearization where the envelope is obtained by RF detection.

The second preferred embodiment FIG. 11 shows the application of the dynamic bias circuitry 61 to the RF feedback linearization 38. The only difference between the operation of the Cartesian system of FIG. 7 is the manner by which "R" is obtained by an envelope detection circuit 62. The improvements in efficiency obtained with this system stem from the same reasons as discussed previously—that is, the dynamic bias circuitry 61 selects the best operating bias for a given output signal and the RF feedback adjusts the input predistortion to the amplifier to achieve exact linearization.

Figure 12:
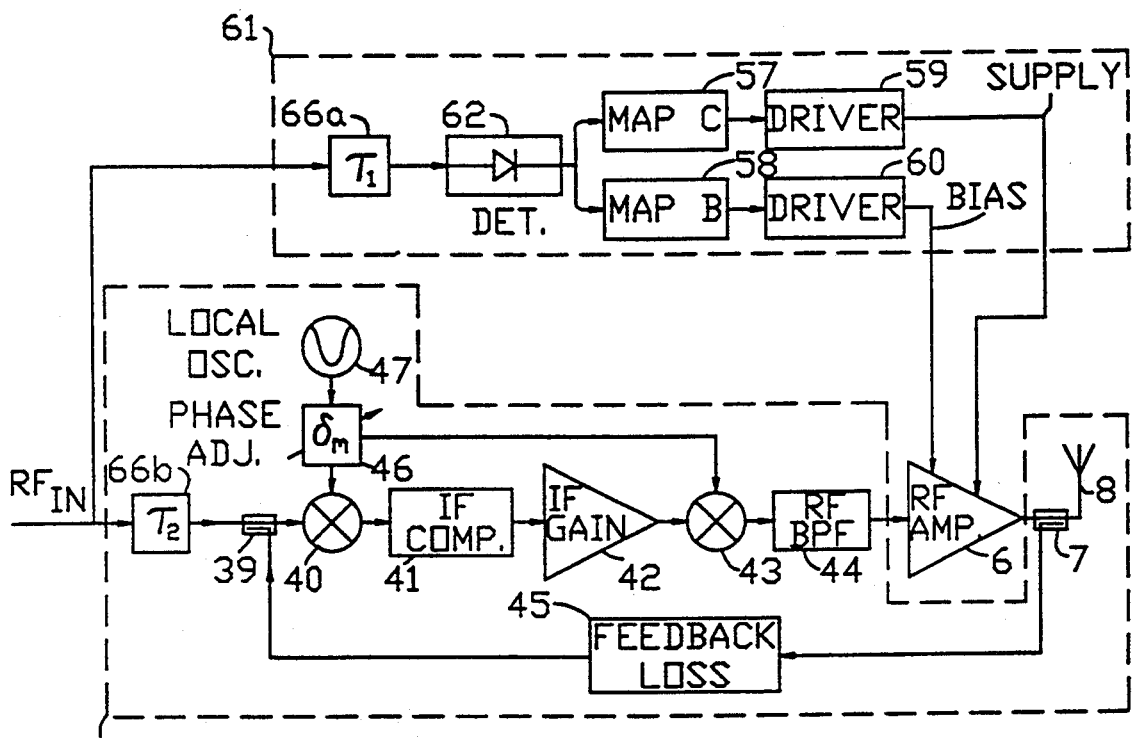
FIG. 12 is a block diagram of the third preferred embodiment applied to IF feedback linearization where the envelope is obtained by RF detection.

FIG. 12 is a block diagram which demonstrates the third embodiment as applied to IF feedback. Again the operation and efficiency improvements given by the dynamic bias circuitry 61 is the same as the previous embodiments.

Figure 13:
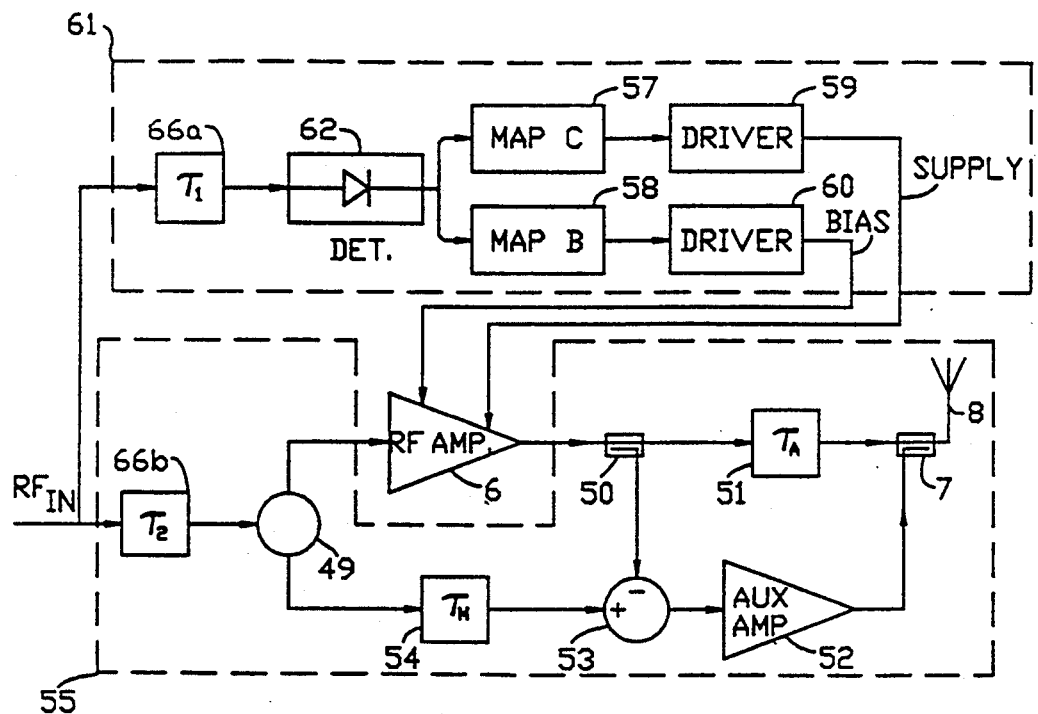
FIG. 13 is a block diagram of the forth preferred embodiment applied to a Feedforward linearization system where the envelope is obtained by RF detection.

The fourth preferred embodiment of the invention as applied to an amplifier with feed forward is shown in FIG. 13. The dynamic bias circuitry 61 is applied to the RF amplifier 6 as with the previous embodiment. The advantage of the dynamic bias circuitry 61 as applied to feedforward linearization 85 stems both from the improvement in efficiency of the main RF amplifier 6 and also the linearization of the RF amplifier 6. Since the RF amplifier is made less non-linear by the application of 61, the auxiliary linear amplifier 52 can be made smaller and so consume less power. Consequently the efficiency of the overall feedforward system is improved.

Figure 14:
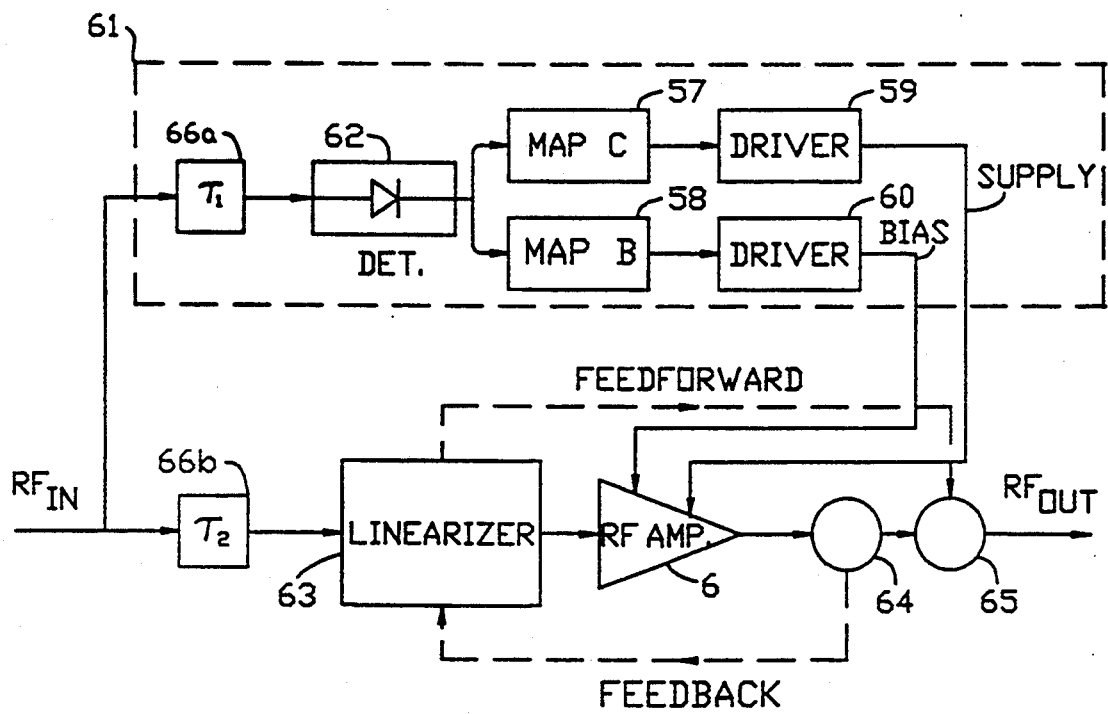
FIG. 14 is a block diagram of other embodiments according to the present invention showing how the invention is applied genetically to any linearization scheme.

FIG. 14 illustrates other embodiments according to the present invention. The linearization scheme is shown as a genetic block 63 which can utilise both feedback and feedforward control to linearize the RF amplifier 6 by application of a predistorting drive signal to the RF amplifier and/or by addition 65 of a distortion cancelling signal at the output. A coupling means 64 is provided by which the feedback signal can be obtained.

As shown with the previous embodiments, the dynamic bias circuitry 61 is applied to the RF amplifier's bias and supply lines. By forcing these lines to a level known to give the best operating efficiency by MAPs 57,58 the linearization automatically adopts the necessary state to maintain exact linearization.

Figure 15:
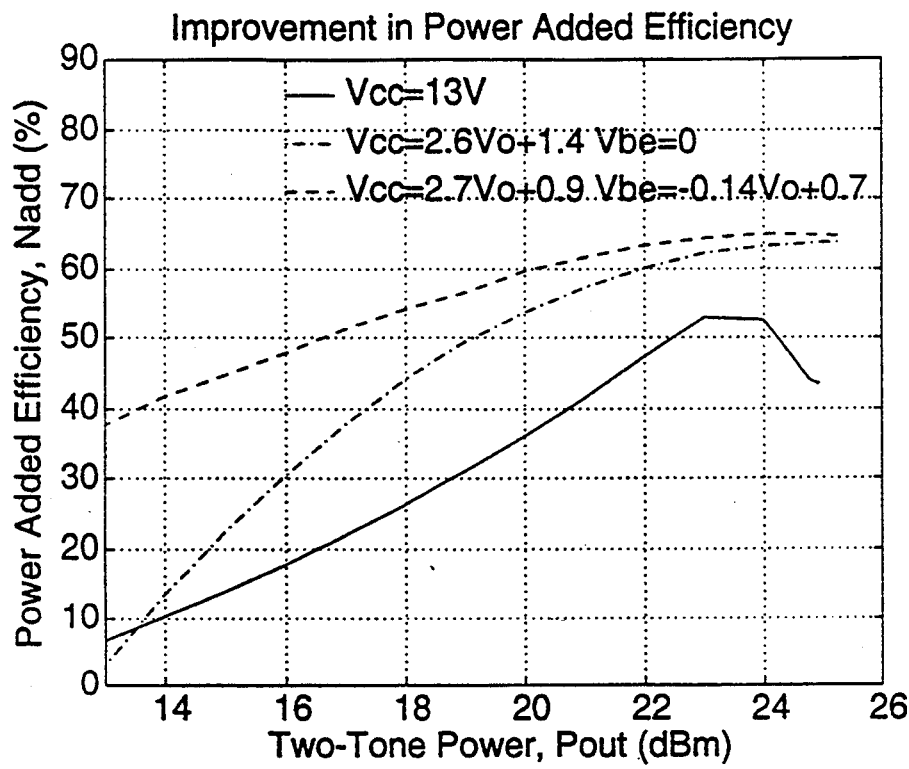
FIG. 15 is a graph showing the improvement in efficiency of the present invention under output power control.
Figure 16:
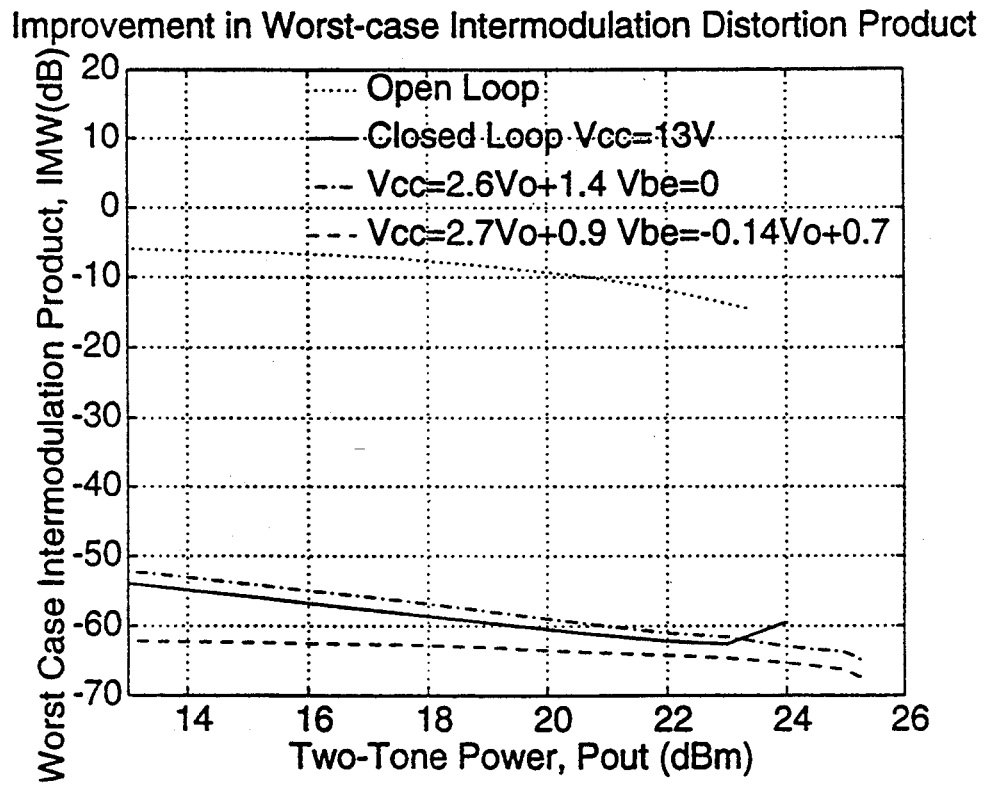
FIG. 16 is a graph showing the improvement in intermodulation distortion and hence linearization effectiveness of the present invention under output power control for a two-tone test.
Figure 17:
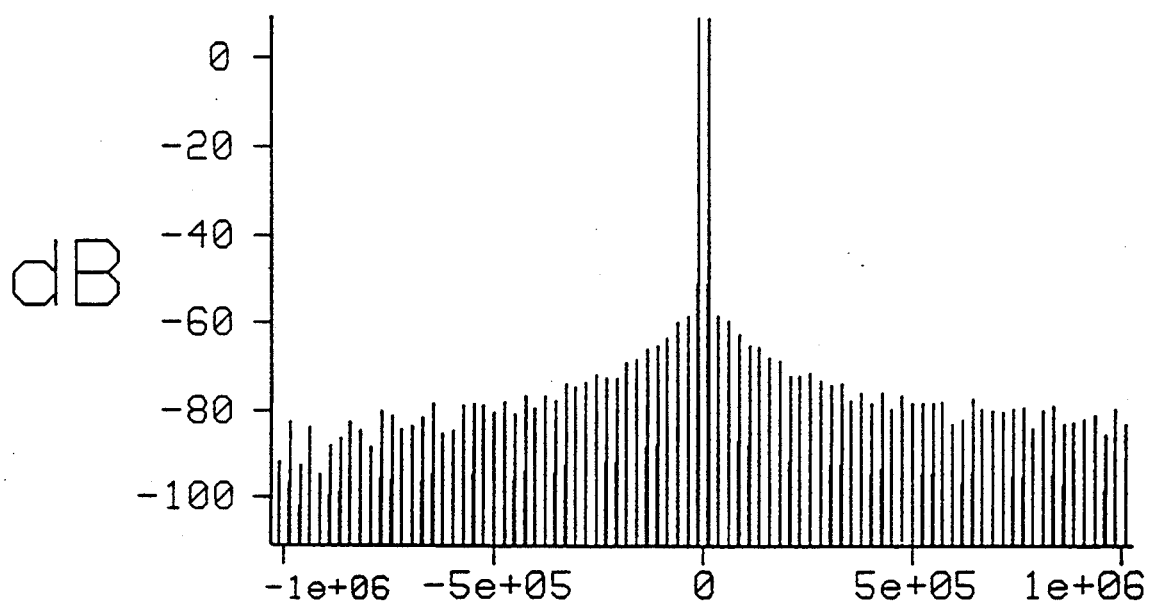
FIG. 17 is a graphical plot of a two-tone test after the application of linearization with a dynamically variable operating point at one output level.

The advantages of this invention are demonstrated in FIGS. 15, 16 and 17. The X-axes of FIGS. 15 and 16 show two-tone output power in dBm. FIG. 15 shows the improvement in power-added efficiency (Nadd) compared to a fixed collector (or drain) voltage with ideal tracking of the mapping functions. Both collector only and collector and base modulation show significant improvements in efficiency particularly at low power levels. FIG. 14 shows the linearization effectiveness of the invention by plotting worst-case intermodulation distortion product (IMW) versus two-tone output power. The introduction of collector only modulation actually results in a minor increase in intermodulation products. Under collector and base control however, the improvement in intermodulation distortion indicates the techniques disclosed herein result in an improvement in the linearization efficacy in addition to a substantial improvement in the power-added efficiency of the amplifier. FIG. 17 shows a typical closed-loop spectral plot of a two-tone test at a power output level of 25.25 dBm with both the collector and base being driven by mapping functions 57, 58.

The improvement in intermodulation performance delivered by the present invention can be exchanged for extra bandwidth or stability in feedback linearization systems.

Since the power supply modulation is not used entirely for linearization purposes as in U.S. Pat. No. 4,631,491 the modulation circuits 59 and 40 do not have to be exact. This is because the linearization scheme is able to modify the input drive signals slightly to achieve the exact desired output. The invention can therefore tolerate ripple in a switch-mode driver 59 which can also have in-band frequency components. The linearization correction applies to the ripple of the power supply driver in addition to the AM-to-AM and AM-to-PM distortions of the non-linear amplifier 6 and hence is an improvement over other systems (such as Koch and Fisher etc.) which utilise envelope feedback only.

We claim:

1. A linearized power amplifier circuit comprising:
    a non-linear radio frequency (RF) power amplifier for amplifying an input signal and producing an output signal corresponding thereto, said input signal having envelope properties, said non-linear amplifier exhibiting non-linear amplitude and phase characteristics and having at least one operating point input;
    dynamic bias modulation means for dynamically modulating the operation of said non-linear amplifier for efficient operation of said non-linear amplifier, said dynamic bias modulation means comprising, an input signal envelope determining means for obtaining an envelope signal from said input signal, mapping means for converting said envelope signal to at least one optimum operating voltage for said non-linear amplifier, and power driver means for applying said at least one operating voltage to said operating point input of said non-linear amplifier; and
    linearization means which is separate and distinct from said dynamic bias modulation means, said linearization means utilizing a signal representation in said circuit that does not result in bandwidth expansion for linearizing and correcting for the non-linear amplitude and phase characteristics of said non-linear amplifier and further for correcting for additional distortion and errors introduced by said dynamic bias modulation means.

2. A linearized power amplifier circuit according to claim 1 wherein said non-linear amplifier has a pair of operating point inputs which comprise a power supply input and a bias port.

3. A linearized power amplifier circuit according to claim 2 wherein said mapping means of said dynamic bias modulation means converts said envelope signal to a power supply operating voltage and a bias port operating voltage, and said power driver means comprises a first power driver for applying said power supply operating voltage to said power supply input of said non-linear amplifier and a second power driver for applying said bias port operating voltage to said bias port.

4. A linearized power amplifier circuit according to claim 3 wherein said mapping means of said dynamic bias modulation means utilizes predetermined amplifier efficiency measurements which are obtained by finding optimum power supply and bias port operating voltages for best efficiency.

5. A linearized power amplifier circuit according to claim 2 wherein said non-linear amplifier comprises a bipolar junction transistor (BJT) having collector and base elements, and wherein said power supply input is coupled to the collector of said BJT, and said bias port is coupled to the base of said BJT.

6. A linearized power amplifier circuit according to claim 2 wherein said non-linear amplifier comprises a field effect transistor (FET) having drain and gate elements, and wherein said power supply input is coupled to the drain of said FET, and said bias port is coupled to the gate of said FET.

7. A linearized power amplifier circuit according to claim 2 wherein said dynamic bias modulation means applies said optimum operating voltage only to said power supply input and not to said bias port of said non-linear amplifier.

8. A linearized power amplifier circuit according to claim 2 wherein said dynamic bias modulation means applies said optimum operating voltage only to said bias port and not to the power supply input of said non-linear amplifier.

9. A linearized power amplifier circuit according to claim 1 wherein said dynamic bias modulation means includes a time delay means for delaying said input signal to improve the efficiency of said dynamic bias modulation means.

10. A linearized power amplifier circuit according to claim 1 wherein said mapping means of said dynamic bias modulation means comprises signal processing means which utilizes predetermined amplifier efficiency measurements to map envelope signals to said at least one optimum operating voltage.

11. A linearized power amplifier circuit according to claim 1 wherein said mapping means of said dynamic bias modulation means employs a simplified transfer function of predetermined amplifier efficiency measurements to map envelope signals to said at least one optimum operating voltage.

12. A linearized power amplifier according to claim 1 wherein said power driver means is formed and constructed for applying said at least one operating voltage to said operating point input of said non-linear amplifier in an efficient but not necessarily accurate manner.

13. A linearized power amplifier circuit according to claim 1 wherein said linearization means comprises of a Cartesian feedback linearization circuit.

14. A linearized power amplifier circuit according to claim 1 wherein said linearization means comprises of a RF feedback-linearization circuit.

15. A linearized power amplifier circuit according to claim 1 wherein said linearization means comprises of an intermediate frequency (IF) feedback linearization circuit.

16. A linearized power amplifier circuit according to claim 1 wherein said linearization means comprises of a feedforward linearization circuit.

17. A linearized power amplifier circuit according to claim 1 wherein said linearization means processes said input signal and includes a delay means for delaying said input signal being processed by said linearization means so it arrives at said non-linear amplifier in a manner which, when combined with said optimum operating point voltage provided by said dynamic bias modulation means, results in improved efficiency.

* * * * *